(12) United States Patent
Burdinski et al.

(10) Patent No.: US 8,714,082 B2
(45) Date of Patent: May 6, 2014

(54) METHOD FOR PATTERNING A SUBSTRATE SURFACE

(75) Inventors: Dirk Burdinski, Essen (DE); Ruben B. A. Sharpe, Hengelo (NL)

(73) Assignee: Koninklijke Philips N.V., Eindhoven (NL)

( * ) Notice: Subject to any disclaimer, the term of this patent is extended or adjusted under 35 U.S.C. 154(b) by 604 days.

(21) Appl. No.: 10/575,437

(22) PCT Filed: Oct. 7, 2004

(86) PCT No.: PCT/IB2004/052009
§ 371 (c)(1),
(2), (4) Date: Apr. 11, 2006

(87) PCT Pub. No.: WO2005/035438
PCT Pub. Date: Apr. 21, 2005

(65) Prior Publication Data
US 2007/0125255 A1    Jun. 7, 2007

(30) Foreign Application Priority Data
Oct. 11, 2003  (GB) .................................. 0323902.7

(51) Int. Cl.
*B44B 11/04* (2006.01)
(52) U.S. Cl.
USPC ........................................... 101/28; 101/483
(58) Field of Classification Search
USPC ..................... 101/28, 327, 492, 483; 264/1.1; 430/320, 322; 977/887
See application file for complete search history.

(56) References Cited

U.S. PATENT DOCUMENTS

| | | | |
|---|---|---|---|
| 6,380,101 B1 | 4/2002 | Breen et al. | |
| 6,517,995 B1* | 2/2003 | Jacobson et al. | 430/320 |
| 2002/0050220 A1* | 5/2002 | Schueller et al. | 101/486 |
| 2002/0098364 A1 | 7/2002 | Bernard et al. | |
| 2002/0132398 A1* | 9/2002 | Deane et al. | 438/151 |
| 2003/0047535 A1* | 3/2003 | Schueller et al. | 216/41 |
| 2004/0231781 A1* | 11/2004 | Bao et al. | 156/230 |
| 2005/0120902 A1* | 6/2005 | Adams et al. | 101/483 |

FOREIGN PATENT DOCUMENTS

WO  9827463 A1  6/1998
WO  WO 02/085639  10/2002

OTHER PUBLICATIONS

Kirill Efimenko et al. "Surface Modification of Sylgard-184 Poly (Dimethyl Siloxane) . . . :" Journal of Colloid and Interface Science; vol. 254; p. 306-315, 2002.
Glasmastar Karin et al: "Silicone Transfer During Microcontact . . . " Langmuir vol. 19; No. 13; Jun. 24, 2003; p. 5475-5483.

(Continued)

*Primary Examiner* — David Banh

(57) ABSTRACT

An elastomeric stamp has a bulk surface from which protruding features extend. A barrier layer covers the bulk surface and the protruding features. After applying an ink solution to the elastomeric stamp and drying the elastomeric stamp, the elastomeric stamp is brought into contact with a surface of a first substrate. The surface of the first substrate has a high affinity with the ink molecules, which is utilized to effectively remove the ink molecules from the contact surfaces of the protruding features. Subsequently, the elastomeric stamp is brought into contact with the surface of a second substrate. Ink molecules are transferred from the edges of the protruding features to the surface of a second substrate, thus forming an ink pattern in the form of a self assembled monolayer on this surface.

6 Claims, 3 Drawing Sheets

(56) References Cited

OTHER PUBLICATIONS

Figure 1A:
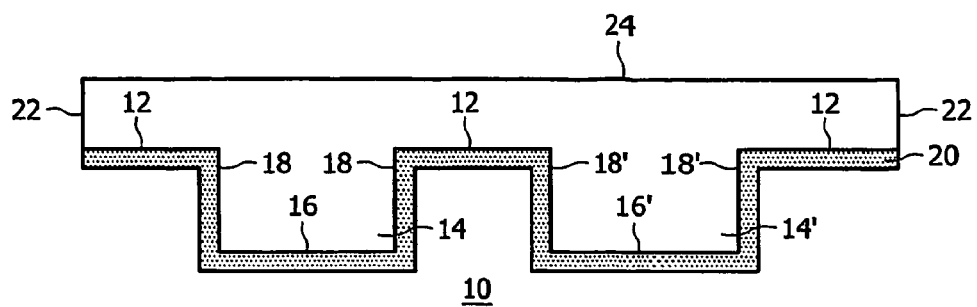

Graham Daniel et al.: "Solution Assembled and Microcontact Printed Monolayers of Dodecanethiol . . . " Langmuir vol. 18 No. 5; 2002; p. 1518-1527.
Cherniavskaya O et al.: "Edge Transfer Lithography of Molecular and Nanoparticle Materials"; Langmuir ACS; vol. 18; Aug. 9, 2002; p. 7029-7034.
David Adams, "Development of Edge Transfer Lithography for Patterning Nanoparticles", Feb. 13, 2002, 1 Page.
Amit Kumar et al, "Features of Gold Having Micrometer to Centimeter Dimensions Can Be Formed Through a Combination of Stamping With an Elastomeric Stamp and an Alkanethiol 'Ink' Followed by Chemical Etching", Applied Physics Letters, 63(1993), No. 14, p. 1-3.

\* cited by examiner

METHOD FOR PATTERNING A SUBSTRATE SURFACE

The present invention relates to a method for patterning a surface of a substrate with an ink.

Traditionally, microscopic patterns of devices including electronic devices have been formed using lithographic steps involving masks to define these patterns on the substrates of the electronic devices. However, the production of masks is an expensive process, and with the downscaling of semiconductor feature sizes, as also predicted by Moore's Law, the patterns to be formed on the substrate have become increasingly complex, which usually resulted in the requirement of a larger number of masks, thus further increasing the production cost of the electronic devices. In addition, it is generally believed that the aforementioned traditional lithographic techniques have matured to such an extent that the further reduction of the feature sizes on the substrates of the electronic devices will be difficult to achieve with these techniques.

Alternative techniques for patterning the substrates of the electronic devices have been developed in an attempt to limit the production cost of the devices as well as to allow for even smaller features to be defined on the substrates. An example of such a technique is disclosed in PCT patent application WO 02/085639 A1, in which an elastomeric stamp having a patterned surface of protruding features separated by cavities is exposed to a desired ink being dissolved in a polar solvent. Typically, a polar solvent having a low affinity with the elastomeric material is chosen, which results in the dewetting of the protruding stamp surfaces and the accumulation of the ink/solvent mixture in the cavities between the protruding regions of the stamp.

After evaporation of the solvent, the contact surfaces of the protruding features of the stamp are brought into contact with the substrate and an ink pattern is transferred to the substrate via the edges of the protruding features of the stamp.

However, this particular technique has a number of disadvantages. The dewetting step can leave traces of the ink on the contact surfaces of the protruding features of the stamp, which can cause blurring of the features printed on the substrate. In addition, only a few hydrophilic ink solutions exhibit the desired dewetting behaviour on the stamp, which also limits applicability of this technique.

The present invention seeks to provide a patterning method according to the opening paragraph that suffers less from these problems.

According to an aspect of the present invention, there is provided a method for patterning a surface of a substrate with an ink, the method comprising the steps of providing an elastomeric stamp having a bulk surface and at least one feature protruding from the bulk surface, the protruding feature having a contact surface and an edge extending from the contact surface to the bulk surface, the protruding feature and the bulk surface carrying a barrier layer; applying a solution of the ink and a solvent to the barrier layer; removing the solvent from the barrier layer; providing a first substrate with a surface having a higher affinity for the ink than the barrier layer; contacting the contact surface of the protruding feature with the surface of the first substrate; transferring the ink from the contact surface of the protruding feature to the surface of the first substrate; removing the elastomeric stamp from the surface of the first substrate; providing a second substrate with a surface having a higher affinity for the ink than the barrier layer; contacting the contact surface of the protruding feature with the surface of the second substrate; and providing the surface of the second substrate with an ink pattern by transferring the ink from the edge of the protruding feature to the surface of the second substrate.

The patterning method of the present invention has a number of advantages. First of all, because of the use of a barrier layer on the elastomeric stamp, an ink cannot penetrate the stamp material, which allows for a large number of inks to be used with the patterning method of the present invention, because there is no risk that during the patterning of the second substrate ink will pass from the stamp to the surface of the second substrate via the contact surface of the protruding feature.

At this point, it is emphasized that an elastomeric stamp having a modified surface layer is known per se; for instance, an elastomeric stamp made of polydimethylsiloxane (PDMS) with a layer of oxidized PDMS on its surfaces is known from the US patent application US 2002/0098364 as well as from the Journal of Colloid and Interface Science, vol. 254, page 306 (2002). However, these stamps have been developed for use in the field of microcontact printing, where the ink is transferred from the contact surface of the protruding feature to the surface of the substrate, with the stamp surface being modified to improve the compatibility of the stamp surface with the ink. Langmuir, volume 19, pages 5475-5483 (2003), discloses a PDMS stamp having an oxidized surface layer acting as a barrier layer to prevent the diffusion from low-weight PDMS oligomers from the stamp material to the surface of the substrate, to avoid significant pollution of the self-assembled monolayer (SAM) of ink molecules on the surface of the substrate, which can deteriorate the properties of the SAM, as for instance has been reported in Langmuir, vol. 18, pages 1518-1527 (2002).

However, it is emphasized that the present invention is partly based on the realization that a modified surface layer can also act as a barrier layer preventing the ink molecules from penetrating the stamp material on the timescales of the substrate patterning process, which is a realization that has not been made in the aforementioned prior art documents. Furthermore, it should be appreciated by those skilled in the art that in the method of the present invention such a stamp, i.e., a stamp having a modified surface layer, is being used in a different way than in case of the prior art methods, because the stamp is being used to transfer the ink pattern to the surface of the substrate from the edge of a protruding feature rather than from the contact surface of the protruding feature.

A further advantage of the patterning method of the present invention is that it does not have to rely on a dewetting step to clear the ink of the contact surface of the protruding feature, which has a limiting effect on the applicability of such a patterning method. Also, it is known from Langmuir, vol. 18, page 7029 (2002) that in order for such a dewetting step to be successful, the contact surface of a protruding feature should not exceed a width of 2 micron, which puts a severe constraint on the pattern design for such a stamp. Instead, according to the present invention, the ink is removed from the contact surface of a protruding feature in an initial printing step. This has the advantage that a larger number of solvents to dissolve the ink can be used, because the solvent does not need to have certain dewetting characteristics when brought in contact with the surface of the stamp, and that protruding features having widths exceeding 2 micron can be used, thus making the patterning method of the present invention more versatile than the one disclosed in PCT patent application WO 02/085639 A1.

In an embodiment, the method further comprises the step of removing a part of the surface of the second substrate, the part being defined by the ink pattern. In this step, which may comprise an etching step, either the part of the substrate that is uncovered by the ink pattern or the part of the substrate that is covered by the ink pattern is removed to fixate a predefined pattern in the substrate surface, in which case the other part of the substrate surface may be protected by a SAM having a higher etch resistance. The method of the present invention can for instance be used in the production of an electronic device to define some of the features of such a device, e.g., conductive tracks. However, it is emphasized that the ink pattern on the substrate surface may also serve a different purpose, e.g., as a first layer of a multi-layer structure to be formed on the substrate surface.

The invention is described in more detail and by way of non-limiting examples with reference to the accompanying drawings, wherein:

FIG. 1a-h depict an embodiment of the method of patterning a substrate with an elastomeric stamp according to the present invention.

It should be understood that the Figures are merely schematic and are not drawn to scale.

According to a first step of the method of the invention, an elastomeric stamp 10 as depicted in FIG. 1a is provided. The elastomeric stamp 10 has a protruding feature 14 and a further protruding feature 14', which extend from a bulk surface 12 of the elastomeric stamp 10. The protruding feature 14 has a contact surface 16 and edges 18 extending from the contact surface 16 to the bulk surface 12, whereas the further protruding feature 14' has a contact surface 16' and edges 18' extending from the contact surface 16' to the bulk surface 12. The bulk surface 12, the edges 14 and 14' and the contact surfaces 16 and 16' are covered by a barrier layer 20, which is impermeable for the inks to be used on the elastomeric stamp 10. The further surfaces 22 and 24 of the elastomeric stamp 10 may also be covered by this barrier layer, although this is not necessary. The protruding feature 16 and the further protruding feature 16' define the shape of the pattern to be printed on the surface of a substrate.

The elastomeric stamp 10 may be formed by known production techniques, e.g., moulding of an elastomeric material such as PDMS in a preformed master. The barrier layer 20 may be formed by known techniques, e.g., modification of the PDMS as disclosed in the US patent application US 2002/0098364 and the Journal of Colloid and Interface Science, 254, page 306 (2002). However, other methods, for instance in which a separate barrier layer 20 is deposited on the aforementioned surfaces of the elastomeric stamp 10, are equally feasible.

Figure 1B:
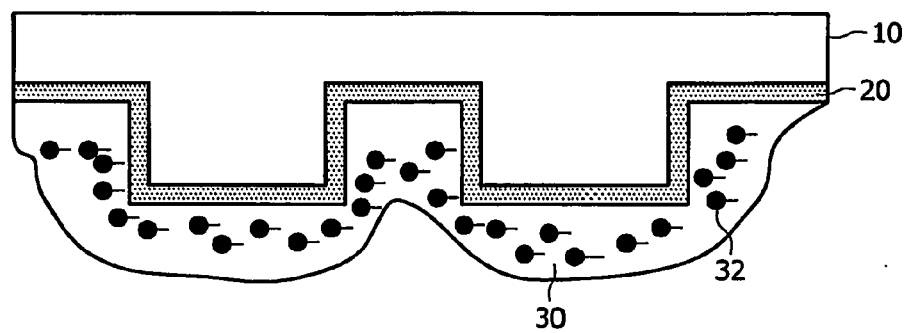
Figure 1C:
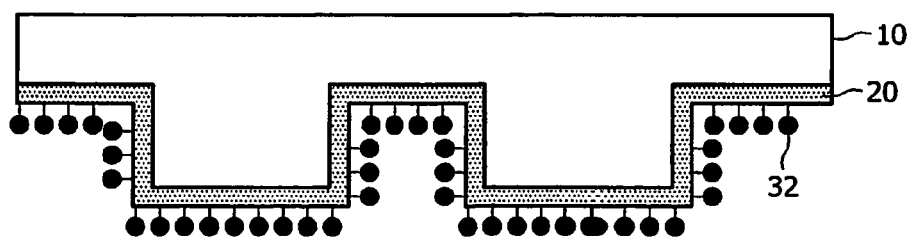

A next step of the method of the present invention is shown in FIG. 1b. A solution of a solvent 30 and an ink 32 is deposited over the barrier layer 20 of the elastomeric stamp 10, after which the solvent 30 is removed by drying the elastomeric stamp 10, e.g., in a $N_2$ flow, thus yielding an elastomeric stamp 10 having a layer of ink molecules 32 adhered to the barrier layer 20, as shown in FIG. 1c. Due to the fact that the barrier layer 20 prevents the penetration of the ink molecules into the elastomeric material of the elastomeric stamp 10, a large number of inks with varying properties can be used. In particular, thiol-based hydrophobic inks may be used, which have the advantageous property of yielding well-defined patterns on a substrate surface due to the fact that these inks do not suffer from excessive spreading, in contrast to hydrophilic inks.

It is emphasized that the use of such hydrophobic inks is prohibited in the patterning method disclosed in disclosed in PCT patent application WO 02/085639 A1, because such inks have a high affinity with hydrophobic elastomeric materials such as PDMS. Consequently, a substantial fraction of the inks is absorbed in the elastomeric stamp. Not only does this mean that larger amounts of ink have to be used to establish a sufficient amount of ink on the edges of the stamp, but the diffusion of ink from the stamp material during the patterning of a substrate surface having a high affinity with the ink to said surface causes unwanted blurring of the printed patterns.

An additional advantage of using an elastomeric stamp 10 having a barrier layer 20 is that, due to the absence of the absorption of some of the ink molecules 32 into the elastomeric stamp 10, the ink concentration in the ink solution can be accurately tuned to establish the desired amount of ink that remains on the barrier layer 20 after removing the solvent 30. This is important, because good control over the amount of ink molecules 32 on the barrier surface 20 improves the quality of the pattern to be defined on the surface of a substrate, i.e., the resolution of the pattern features.

Figure 1D:
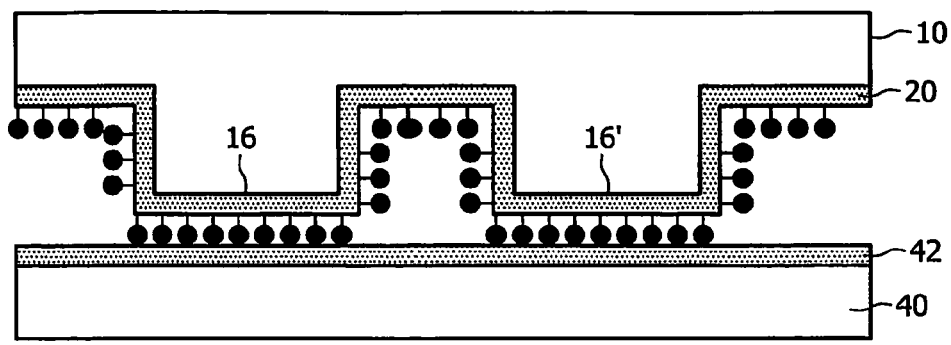
Figure 1E:
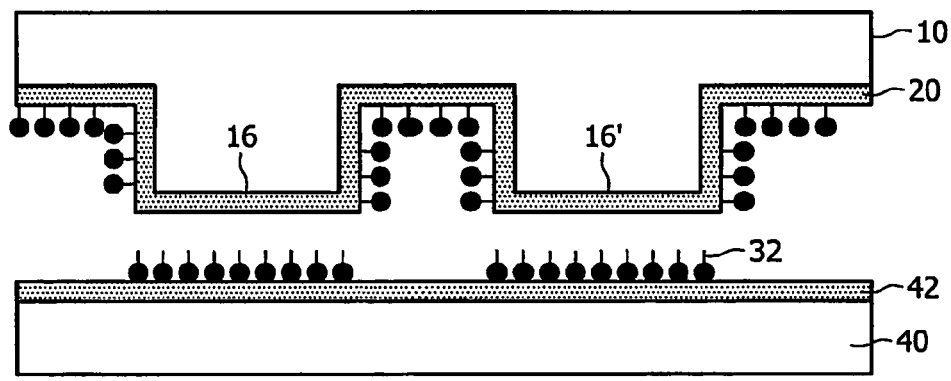

In a next step, the contact surfaces 16 and 16' of the protruding features 14 and 14' of the elastomeric stamp 10 are placed on a substrate 40 having a surface 42, as shown in FIG. 1d. The surface 42, which may include a separate layer formed of a suitable coinage metal including noble metals such as gold, has a higher affinity with the ink molecules 32 than the barrier layer 20 has. Consequently, the ink molecules 32 at the contact surfaces 16 and 16' are being transferred from the contact surfaces 16' and 16' to the surface 42, thus yielding an elastomeric stamp 10 that no longer carries ink molecules 32 adhered to the barrier layer 20 on the contact surfaces 16 and 16', but only on the barrier layer 20 over the edges 18 and 18' as well as over the bulk surface 12, as shown in FIG. 1e.

Due to the fact that in the method of the present invention no dewetting step is required to remove the ink molecules 32 from the contact surfaces 16 and 16', a wider variety of solvents 30 can be used to dissolve the ink molecules 32, making the patterning method of the present invention more versatile than the method disclosed in PCT patent application WO 02/085639 A1. Also, the removal of ink molecules 32 by bringing the contact surfaces 16 and 16' into contact with a surface 42 having a high affinity for the ink molecules 32 is very a effective way of clearing the ink molecules 32 of the contact surfaces 16 and 16', which is advantageous because residual ink molecules 32 on these surfaces can cause blurring of the pattern to be printed, which is effectively avoided.

It is pointed out that an increase in the contact time between the contact surfaces 16 and 16' of the elastomeric stamp 10 and the surface 42 will result in the transfer of an increasing fraction of the ink molecules 32 from the edges 18 and 18' to the surface 42. This can be utilized to further control the amount of ink molecules 32 that remain at the elastomeric stamp 10, which is advantageous in terms of pattern definition quality, as previously explained.

Figure 1F:
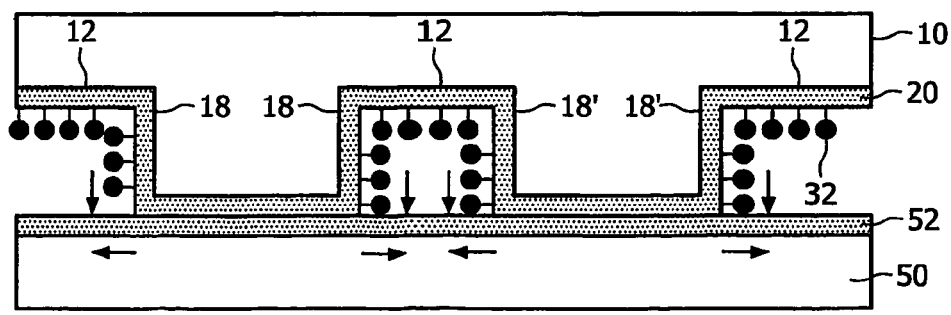

In a next step, which is depicted in FIG. 1f, the contact surfaces 16 and 16' of the protruding features 14 and 14' of the elastomeric stamp 10 are placed on a second substrate 50 having a surface 52. Like the surface 42, the surface 52 may be a separate layer formed of a suitable coinage metal including noble metals such as gold, and has a higher affinity with the ink molecules 32 than the barrier layer 20 has. The ink molecules 32 are transferred from the barrier layer 20 on the edges 18 and 18' of the elastomeric stamp 10 to the surface 52 as indicated by the vertical arrows.

The contact time between the elastomeric stamp 10 and the surface 52 can be used to determine the amount of ink molecules 32 that will be transferred from the edges 18 and 18' of the elastomeric stamp 10 to the surface 52. Also, increasing this contact time will increase the lateral movement of the ink molecules 32 over the surface 52, as indicated by the horizontal arrows. The physical properties of the ink also play an important role in this process; a hydrophobic ink such as octadecanethiol typically spreads relatively slow over the surface 52, whereas a hydrophilic ink such as 11-mercaptoundecanoic acid spreads relatively fast over the surface 52. To suppress the gas phase diffusion of the ink molecules 32 from the bulk surface 12 of the elastomeric stamp 10 to the surface 52, high boiling inks may be used. Alternatively, the bulk surface 12 may be kept away far enough from the surface 52, e.g., 300 nm, to limit the effect of gas phase diffusion from the bulk surface 12.

Figure 1G:
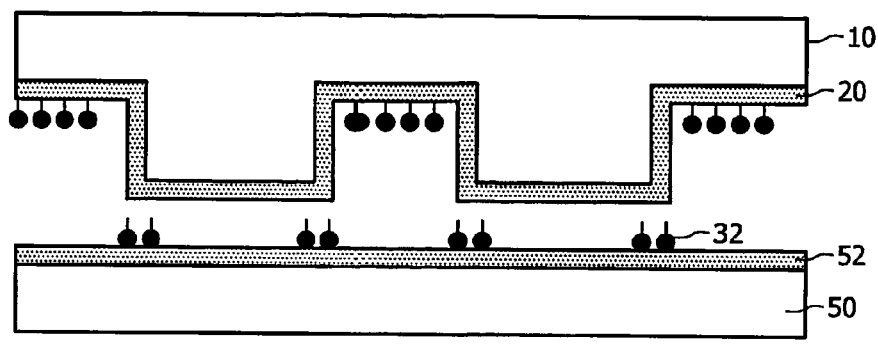
Figure 1H:
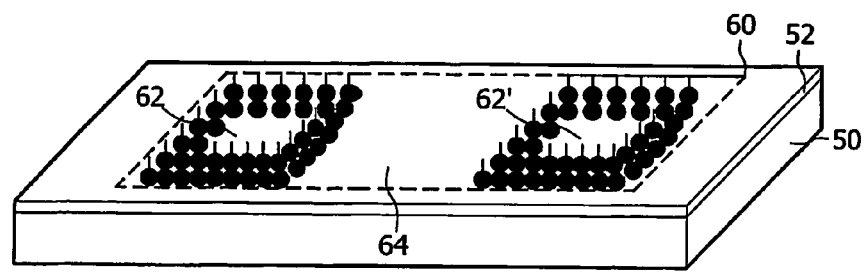

Upon removal of the elastomeric stamp 10 from the surface 52, as shown in FIG. 1g, the desired pattern 60 of ink molecules 32 is adhered to the surface 52 of the substrate 50, as shown in FIG. 1h. The pattern 60 includes square 'hollow' features having a border of ink molecules 32 around an uncovered area 62 and 62' of the surface 52. The uncovered areas 62 and 62' are the areas where the contact surfaces 16 and 16' of the respective protruding features 14 and 14' rested on the surface 52. The area 64 of the surface 52 was facing the bulk surface 12 of the elastomeric stamp 10 between the protruding features 14 and 14' during the patterning of the substrate 50.

The area 64 is uncovered by ink molecules 32 by way of non-limiting example only; it will be appreciated by those skilled in the art that a longer contact time between the elastomeric stamp 10 and the surface 52 of the substrate 50 will increase the lateral movement of ink molecules 32 over the surface 52, which for instance will lead to the partial or complete coverage of the area 64. Thus, both hollow and filled structures can be defined with the patterning method of the present invention. Furthermore, it will be appreciated by those skilled in the art that the pattern features are not limited to a rectangular shapes; other shapes such as circular shapes or linear shapes are equally feasible.

The printing method of the present invention facilitates the deposition of a wide variety of SAM patterns with resolutions in the submicron domain, e.g., a few hundred nanometers. Such a SAM pattern may be used to act as a resist in a subsequent etching step. Alternatively, the SAM pattern may be used to act as a mask in a subsequent etch resist deposition step, after which the SAM and underlying layers are removed in a subsequent etch step. The SAM pattern may also be used as an anchor for the formation of a multi-layer structure on the substrate surface 52, which may be achieved by chemical reaction or physical interaction of the SAM with subsequently deposited materials on top of the SAM.

A subsequent etching step may be performed using known etching techniques; for instance, in the case of a surface 52 comprising a gold layer carrying a thiol-based SAM acting as a wet etch resist, an etching bath composition as disclosed in Langmuir, 18, 2374-2377 (2002), containing 1 M KOH, 0.1 M $K_2SO_3$, 0.01 M $K_3Fe(CN)_6$, and 0.001 M $K_4Fe(CN)_6$ in water half saturated with n-octanol, may be used.

It should be noted that the abovementioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. A method for transferring an ink pattern, the method comprising acts of:
    providing an elastomeric stamp comprising a bulk surface, at least one protruding feature having a contact surface and an edge extending from the contact surface to the bulk surface, and a barrier layer having a first affinity for ink and covering the contact surface, the edge, and the bulk surface;
    applying a solution of the ink and a solvent to the barrier layer, the barrier layer preventing molecules of the ink from penetrating the elastomeric stamp;
    first contacting for a first duration of time the contact surface with a surface of a first substrate having a second affinity for the ink higher than the first affinity;
    transferring only the ink from the contact surface to the surface of the first substrate as a result of the first contacting;
    second contacting for a second duration of time the contact surface with a surface of a second substrate having a third affinity for the ink higher than the first affinity; and
    transferring only the ink from the edge to the surface of the second substrate forming the ink pattern as a result of the second contacting,
    wherein the second contacting follows the first contacting without intervening dewetting acts.

2. The method as claimed in claim 1, further comprising an act of removing a part of the surface of the second substrate defined by the ink pattern.

3. The method as claimed in claim 2, wherein the removing of the part of the surface of the second substrate comprises etching.

4. The method of claim 1, wherein the second duration of time allows lateral movement over the surface of the second substrate of the ink transferred from the edge.

5. The method of claim 1, further comprising an act of removing the solvent from the barrier layer.

6. The method of claim 1, wherein an increase in the first and second duration of time between the contact surface and the surface of the first or second substrate results in the transfer of an increasing fraction of the ink from the edges.

* * * * *